US006448095B1

(12) United States Patent
Birdsley et al.

(10) Patent No.: US 6,448,095 B1
(45) Date of Patent: Sep. 10, 2002

(54) CIRCUIT ACCESS AND ANALYSIS FOR A SOI FLIP-CHIP DIE

(75) Inventors: Jeffrey D. Birdsley; Michael R. Bruce; Brennan V. Davis; Rosalinda M. Ring, all of Austin; Daniel L. Stone, Cedar Park, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 40 days.

(21) Appl. No.: 09/755,013

(22) Filed: Jan. 5, 2001

(51) Int. Cl.[7] .......................... H01L 21/00; H01L 21/66; G01R 31/26
(52) U.S. Cl. ........................ 438/12; 324/765; 438/14; 438/17
(58) Field of Search .................... 438/5, 10, 12, 438/13, 14, 15, 17, 128, 129, 130, 131, 132; 324/765, 769

(56) References Cited

U.S. PATENT DOCUMENTS 5,208,178 A * 5/1993 Usami .......................... 438/12

OTHER PUBLICATIONS

T. Kane, "Characterization and Isolation Techniques in Silicon on Insulator Technology Microprocessor Designs", 2000, ISTFA 2000, ASM International, Materials Park; OH 44073–0002, pp. 327–330.*
R. Van Camp, "Reliability of a Focused Ion Beam Repair on Digital CMOS Circuits", 1996, Microelectronic Reliability, vol. 36, No. 11/12, pp. 1787–1790.*
J. Meingailis et al., "The focused ion beam as an integrated circuit restructuring tool", 1986, J. Vac. Sci. Tachnol. B 4 (1), pp. 176–180.*
L.R. Harriott, "Integrated circuit repair using focused ion beam milling", 1986, J. Vac. Sci. Technol. B 4 (1), pp. 181–184.*

* cited by examiner

Primary Examiner—Michael Sherry
Assistant Examiner—Evan Pert

(57) ABSTRACT

Analysis of a flip-chip type IC die having SOI structure is enhanced via analysis and repair of the die that make possible analysis that would typically result in the die being in a state of disrepair. According to an example embodiment of the present invention, a focused ion beam (FIB) is directed at a back side of a flip-chip die having a circuitry in a circuit side opposite a back side, wherein the circuitry including silicon on insulator (SOI) structure. The FIB is used to remove a selected portion of substrate including a portion of the insulator of the SOI structure from the die. The removed substrate exposes an insulator region in the die, and a signal is coupled from circuitry in the die via the exposed insulator region and used to analyze the die. Material is deposited in the exposed region and the selected portion of the die that had been removed is reconstructed. The reconstruction takes place before, during or after the signal is coupled, depending upon the die being analyzed and the type of analysis being performed. In this manner, access for analyzing the die is improved via the ability to couple a signal through the insulator and to repair a portion of the die that has been altered for analysis. Analysis that would otherwise be destructive can be performed and the ability of the die to function after analysis can be maintained.

20 Claims, 4 Drawing Sheets

CIRCUIT ACCESS AND ANALYSIS FOR A SOI FLIP-CHIP DIE

FIELD OF THE INVENTION

The present invention relates generally to semiconductor devices and their fabrication and, more particularly, to semiconductor devices and their manufacture involving techniques for manufacturing, analyzing and debugging circuitry within an integrated circuit die.

BACKGROUND OF THE INVENTION

Recent technological advances in the semiconductor industry have permitted dramatic increases in circuit density and complexity, and commensurate decreases in power consumption and package sizes for integrated circuit devices. Single-chip microprocessors now include many millions of transistors operating at speeds of hundreds of millions of instructions per second to be packaged in relatively small, air-cooled semiconductor device packages. A byproduct of these technological advances has been an increased demand for semiconductor-based products, as well as increased demand for these products to be fast, reliable, and inexpensive. These and other demands have led to increased pressure to manufacture a large number of semiconductor devices at an efficient pace while increasing the complexity and improving the reliability of the devices.

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

One type of circuit structure used in semiconductor devices is silicon-on insulator (SOI) structure. In typical SOI structures, an insulator layer is formed over semiconductor die substrate, and a thin layer of silicon is formed on the insulator. Source and drain regions are then formed in the silicon layer and over the insulator. One advantage of such structure is that a transistor using the source and drain regions is able to switch faster than a transistor formed using conventional methods, due to reduced capacitance in the resulting structure. However, analysis of devices that employ SOI structure is challenging because accessing source, drain or other circuit regions often requires or at least benefits from destruction of a portion of the structure. The insulator portion of the SOI structure makes this access difficult because, for example, the circuitry is formed under the SOI when approached from the back side of a flip-chip die. In addition, analysis of the die is better executed when the insulator portion is maintained intact. For these and other reasons, a method and system for analysis and repair of SOI structure in IC devices that address these challenges would be beneficial.

SUMMARY OF THE INVENTION

The present invention is directed to a method and system for accessing and analyzing circuitry in a flip-chip die having SOI structure. A particular aspect of the present invention is directed to providing the ability to access transistors and other circuit regions and to repair and/or reconstruct the accessed regions. The present invention is exemplified in a number of implementations and applications, some of which are summarized below.

According to an example embodiment, the present invention is directed to a method for analyzing a flip-chip semiconductor die having SOI structure and a circuit side opposite a back side. A focused ion beam (FIB) is directed at the back side of the die and a selected portion of substrate including a portion of the insulator of the SOI structure is removed from the die. The removed substrate exposes an insulator region in the die. A signal is coupled from a circuit portion in the circuit side of the die via the exposed region and the die is analyzed therefrom. Material is deposited in the exposed region and the selected portion of the die that had been removed is reconstructed. In this manner, access for analyzing the die is improved via the ability to couple a signal through the insulator and to repair a portion of the die that has been altered for analysis. Analysis that would otherwise be destructive can be performed and the ability of the die to function after analysis can be maintained.

In another example embodiment of the present invention, a system is adapted for analyzing a flip-chip semiconductor die having SOI structure and a circuit side opposite a back side. The system includes a FIB arrangement adapted to remove a selected portion of substrate from the die and form an exposed region that includes a portion of the insulator of the SOI structure. A testing arrangement is adapted to couple a signal from a selected circuit portion in the die via the exposed region and to analyze the die via the coupled signal. A deposition arrangement is adapted to deposit material in the exposed region and to reconstruct the selected portion of the die having been removed.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
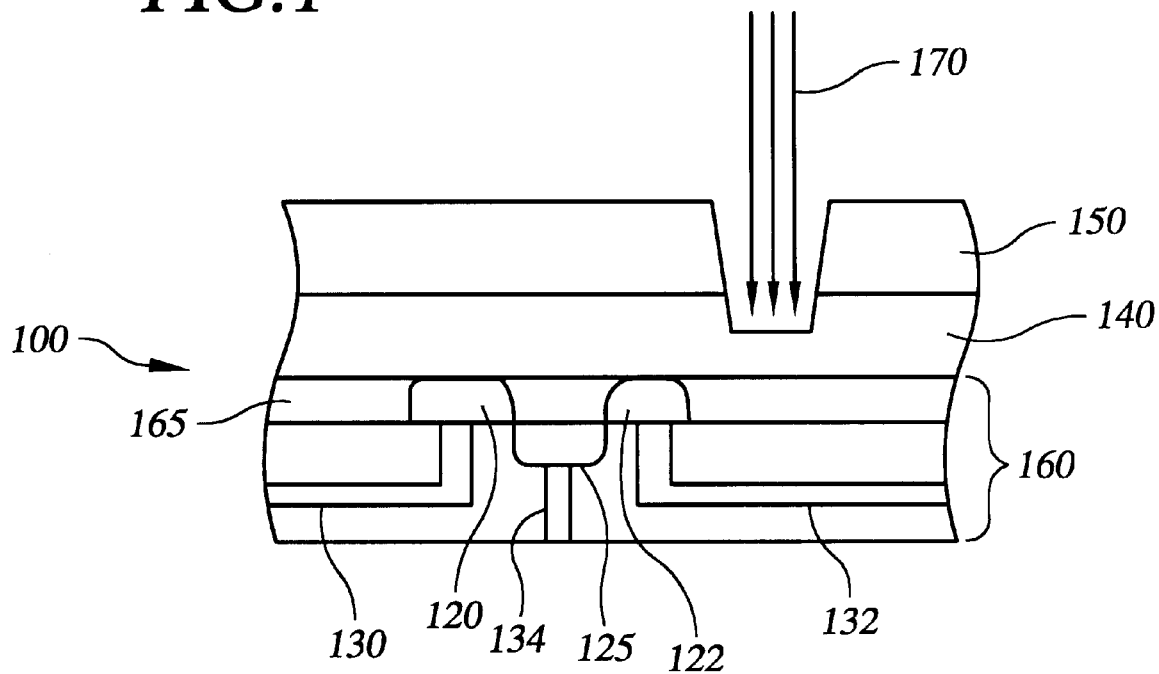
FIG. 1 is a semiconductor die undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found particularly suited for integrated circuit dies having SOI structure and benefiting from isolation and analysis of circuit regions in the die. While the present invention is not necessarily so limited, various aspects of the invention may be appreciated through a discussion of various examples using this context.

According to an example embodiment of the present invention, a FIB is used to modify and repair a selected portion of a flip-chip semiconductor die having SOI structure. First, the FIB is directed at a back side of the die and is used to remove a portion of silicon substrate from the backside and, once enough silicon has been removed to expose the insulator layer of the SOI structure, to remove a portion of the insulator and form an exposed region. A signal is then obtained from a portion of circuitry in a circuit side of the die via the exposed insulator region. Obtaining a signal via the insulator portion makes possible the operation of the die during analysis that closely represents actual operation of the die under conditions where the insulator is maintained intact. The signal is used for analyzing the die, such as to detect a defect, monitor operation or for design debug. After one or more desired signals have been obtained and the underlying circuitry analyzed, the FIB is used to deposit material at the exposed region and thereby reconstruct the die, including reconstructing the portion of the insulator layer having been removed. This process facilitates the ability to test the die without necessarily destroying it.

The die is analyzed in various manners selected to provide desired information. In one implementation, the die is operated under normal operating conditions while the signal is being obtained from the circuitry. Die performance, the existence of defects and other aspects of the die operation are monitored via the signal. In other implementations, the die is operated in a manner that addresses or targets a selected characteristic of the die to be analyzed. For example, the die can be operated under conditions (e.g., temperature, speed, input data or power level) that are known to cause a selected failure. These operating conditions can further be implemented in a loop to cycle the die through a selected failure condition.

Other stimulation, either in addition to or in the alternative to operating the die, is used to effect selected stimulation to the die in additional example embodiments of the present invention. For example, a laser, heat, the FIB or an e-beam can be directed at the die to stimulate circuitry in the die. These examples are particularly useful for application via an exposed region created by the FIB.

The FIB is used to selectively remove and/or deposit material in the die for particular applications. In one implementation, the FIB is used to remove a portion of circuitry in the die. This is useful, for example, for making cuts to interconnects to isolate a selected portion of circuitry in the die, such as a transistor. Once the circuitry is isolated, it is tested independently of surrounding circuitry. In another implementation, additional circuitry is formed with the FIB.

The FIB is adapted to be used, for example, to deposit conductive material to form interconnects between selected circuitry in the die. In another example, the FIB is used to deposit a conductive probe that is used to electrically access a selected portion of circuitry in the die for analysis, stimulation or other purposes. Once the probe is formed, other portions of the die surrounding the probe can be rebuilt, such as by depositing insulator material having been removed during the opening of a path for the probe to be formed within. In still another example embodiment, the FIB is used to deposit material to repair a portion of the die, such as a void in an interconnect or to remove and replace contaminated substrate in the die.

FIG. 1 shows a semiconductor die 100 undergoing analysis, according to an example embodiment of the present invention. The die has source and drain regions 120 and 122, and a gate 125 that make up a transistor. The transistor is coupled to interconnects 130, 132 and 134, and is located in a circuit side 160 of the die. The source and drain regions are formed in a silicon layer 165 that is formed on an insulator layer 140 as part of a silicon-on-insulator (SOI) structure. A portion of the backside 150 and the insulator 140 are exposed with a FIB 170. A signal is then coupled from circuitry in the die via the exposed portion of the insulator, such as via capacitively coupling a signal to or from the circuitry below. After selected analysis has been performed, the FIB is then used to deposit material over the exposed region and reconstruct the portion of the die that was removed. For example, in the instance of a die having buried oxide (BOX) as the insulator material, the FIB would be used to deposit an oxide, alone or in combination with other common oxide deposition steps, to replace that portion of the oxide that was removed.

Figure 2:
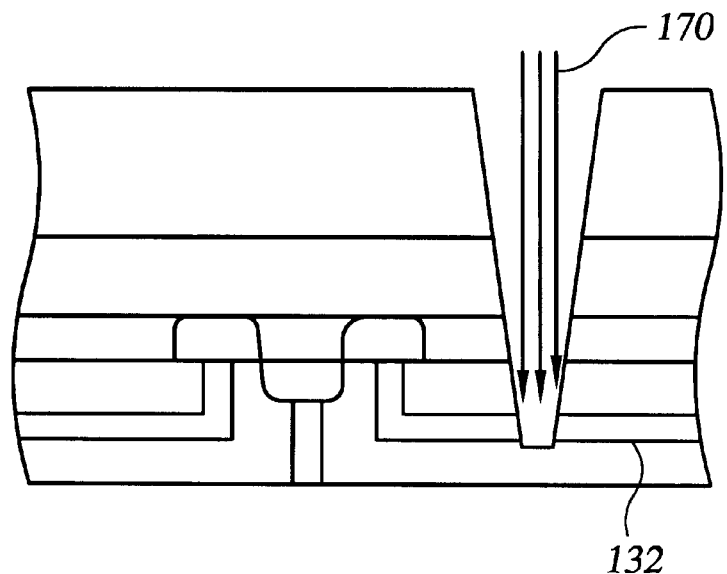
FIG. 2 is the semiconductor die of FIG. 1 undergoing further analysis, according to another example embodiment of the present invention.

FIG. 2 shows the die of FIG. 1 having undergone additional material removal, according to another example embodiment of the present invention. The FIB 170 is used to create an opening through the insulator portion of the SOI structure, through a portion of material in the circuit side and to sever the interconnect 132. By severing the interconnect 132, the FIB is used to isolate the source/drain region 122 from circuitry coupled to the interconnect 132. Testing is performed on the die, and the portion of the die having been removed with the FIB is replaced. For example, the FIB can be used to repair the interconnect 130 by depositing a conductive material, followed by deposition of material to repair the remaining portions having been removed.

Figure 3:
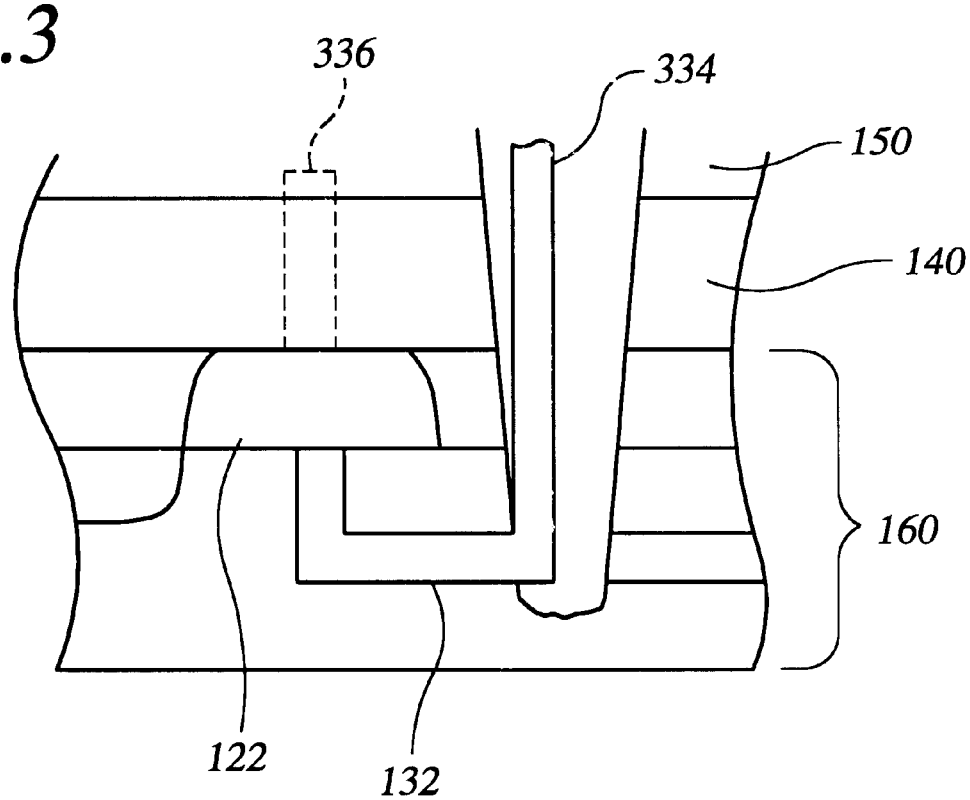
FIG. 3 is the semiconductor die of FIG. 2 undergoing further analysis, according to another example embodiment of the present invention.

FIG. 3 shows another example embodiment of the present invention, in which the die of FIG. 2 is further analyzed by depositing a conductor 334 in the opening created by the FIB 170. The conductor is coupled to the interconnect 132, is electrically coupled to the source/drain region 122 and is adapted to supply stimulus to the source/drain region. In an alternate example embodiment, a conductor 336 is formed over the source/drain region 122. This is done in combination with isolating the transistor by severing the interconnect 132, as shown in FIG. 2. After the die is analyzed, portions of the die having been removed are repaired. The repair may, for example, include removing the conductor 334 and replacing it with insulator, bulk silicon, or whatever type material is desired for reconstruction of the die. Alternately, some or all of the conductor are left in place in applications where such removal is undesirable or unnecessary.

Figure 4:
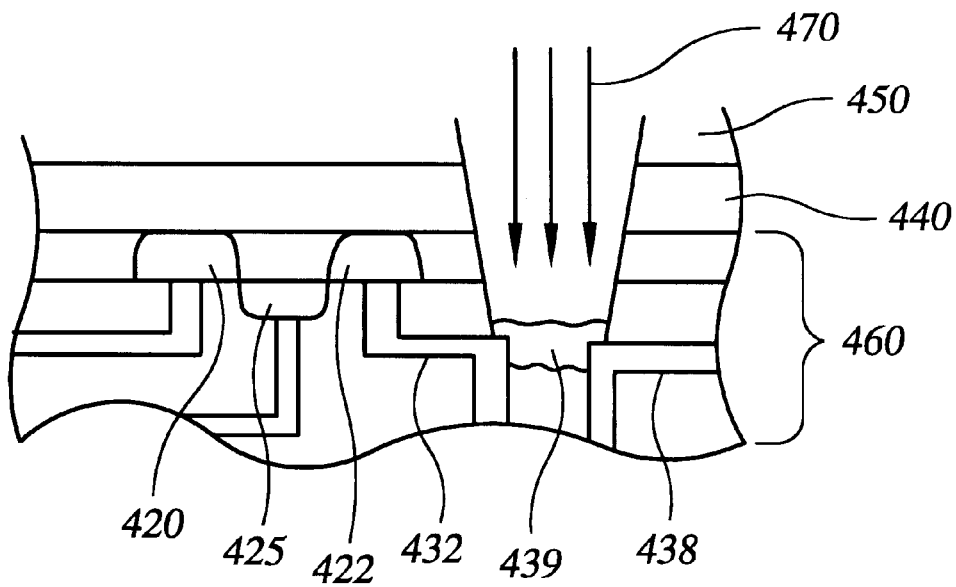
FIG. 4 is a semiconductor die undergoing analysis, according to another example embodiment of the present invention.

FIG. 4 shows a semiconductor die undergoing circuit alteration, according to another example embodiment of the present invention. The die, as shown inverted, includes a back side 450, an insulator portion 440 of SOI structure formed over the back side, and a circuit layer 460. A FIB 470 is directed at the die and used to remove a portion of the backside, the insulator and the circuit layer. The FIB is then used to deposit conductive material 439 in an exposed portion where material has been removed. The conductive material connects two interconnects 432 and 438, which effectively couples interconnect 438 to a source drain region 422 of a transistor including source/drain regions 420 and 422, and gate 425. In a similar manner, other alterations can be made to the die. In one instance, the die is tested after the conductive material 439 is in place. After testing, the material 439 is removed and the die is reconstructed using the FIB to replace the portions that have been removed. In another instance, the conductive material 439 is left in place and the FIB is used to reconstruct the die with the conductive material in place.

One acceptable technique for FIB reparation using conductive and/or insulative materials is discussed in U.S. Pat. No. 6/372,627, issued Apr. 16, 2002 and entitled "Arrangement and Method for Characterization of a FIB Insulator Deposition." With this approach, for example, repair of and/or interconnections to circuitry in the die can be made.

Figure 5:
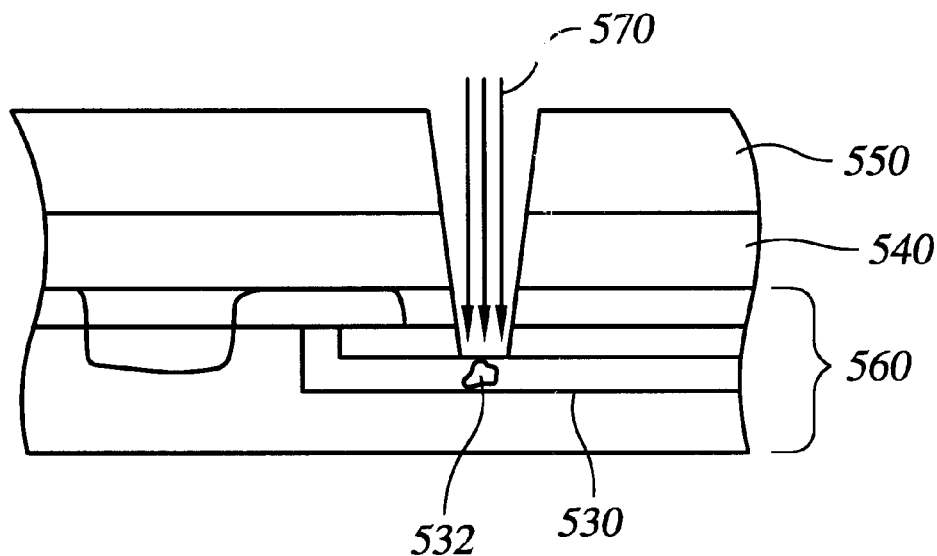
FIG. 5 is a semiconductor die undergoing circuit repair, according to another example embodiment of the present invention.

In addition to testing and circuit alteration, other aspects of the present invention involve the repair of defects in a semiconductor die. For example, FIG. 5 shows another example embodiment of the present invention wherein a void 532 in an interconnect 530 is accessed and repaired. A FIB 570 is used to remove portions of the die including a back side 550, insulator 540 and a circuit side 560. The FIB exposes the void and is subsequently used to deposit conductive material in the void (not shown). After the conductive material has been deposited, the portions of the die that were removed are repaired.

Figure 6:
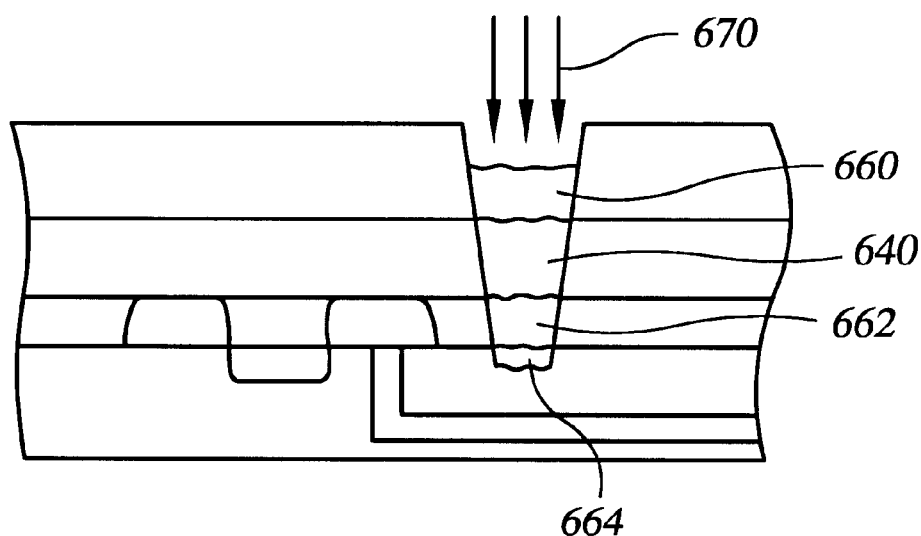
FIG. 6 is a semiconductor die undergoing repair after processing, according to another example embodiment of the present invention.

In each of the above example embodiments, the die can be repaired in several manners. For example, FIG. 6 shows one example embodiment wherein material 664 in a circuit side, epitaxial silicon 662, insulator 640 and bulk silicon 660 have been deposited using a FIB. 670. The material deposited is shown by way of example and is applicable to various implementations, including circuit repair, testing and analysis.

Figure 7:
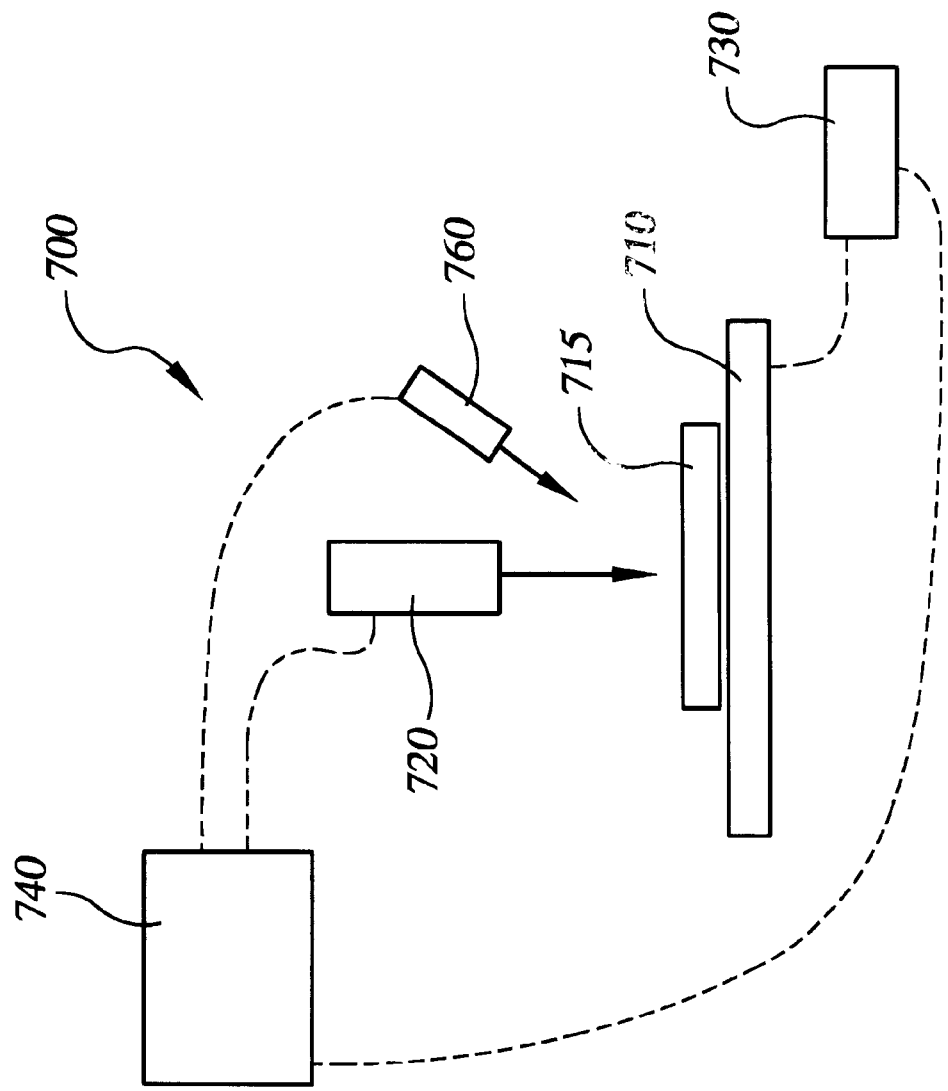
FIG. 7 is a system for analyzing a semiconductor die, according to another example embodiment of the present invention.

In still another example embodiment of the present invention, FIG. 7 shows a system 700 adapted to analyze a semiconductor die and to reconstruct selected portions of the die having been removed for the analysis. The system includes a stage 710 adapted to hold a SOI die 715 and optionally coupled to a test device 730. Test device 730 is adapted to provide stimulus to the die 715 via the stage 710 for analysis. In one implementation, the test device is further adapted to detect a response from the die to stimulus. A FIB device 720, such as a device available from FEI Company at 7451 NW Evergreen Parkway in Hillsboro, Oreg., is adapted to remove a portion of the die 715 an d form an exposed region that includes a portion of the insulator of the SOI die, and to repair the removed portion after analysis has been performed.

The system 700 also optionally includes a beam stimulation device 760 adapted to direct a beam at the exposed portion created by the FIB 720. The device 760 includes one or more of a laser beam device and an electron-beam device. In addition, a controller 740 is further optionally coupled to one or more of the FIB 720, the stimulation device 760 and the test device 730. The controller is adaptable to control the devices to which it is coupled, such as to control the FIB to remove material from and subsequently repair the semiconductor die 715.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a flip-chip semiconductor die having SOI structure and a circuit side opposite a back side, the method comprising:

directing a focused ion beam (FIB) at the back side of the die, removing a selected portion of substrate from the die and forming an exposed insulator region, the selected portion including a portion of the insulator of the SOI structure;

coupling a signal from a circuit portion in the circuit side of the die via the exposed region and analyzing the die therefrom; and depositing material in the exposed region and reconstructing the selected portion of the die having been removed.

2. The method of claim 1, further comprising depositing conductive material and forming a probe, wherein coupling a signal includes coupling a signal from the probe.

3. The method of claim 1, further comprising editing circuitry in the die prior to coupling a signal from a circuit portion in the die.

4. The method of claim 3, wherein coupling a signal from a circuit portion includes coupling to the edited circuitry.

5. The method of claim 3, wherein performing circuit edits includes isolating a circuit element in the die.

6. The method of claim 5, wherein performing circuit edits includes cutting a metal interconnect.

7. The method of claim 3, wherein editing circuitry in the die includes electrically connecting at least two circuit portions.

8. The method of claim 2, further comprising stimulating the die, wherein coupling a signal includes detecting a response to the stimulus.

9. The method of claim 8, wherein stimulating the die includes at least one of: powering the die, applying test signals to the die and exciting the die using external stimulus via the back side of the die.

10. The method of claim 1, further comprising using the FIB to repair a defective portion of the die, the reparation including forming a conductive material with an insulative shroud.

11. The method of claim 10, wherein repairing a defective portion of the die is responsive to coupling a signal and detecting a defect therefrom.

12. The method of claim 10, wherein coupling the signal includes detecting that the repair was effective.

13. The method of claim 1, wherein coupling a signal includes coupling a signal from at least one of: a source, a drain and an interconnect.

14. The method of claim 1, wherein removing a selected portion of substrate includes leaving a portion of the insulator intact, and wherein coupling a signal includes capacitively coupling a signal via the intact insulator portion.

15. A method for post-manufacturing analysis of a flip-chip integrated circuit die having SOI structure and a circuit side opposite a back side, the method comprising:

directing a FIB at the back side and etching through the insulator portion of the SOI structure;

etching a portion of circuitry in the die with the FIB and thereby electrically isolating a SOI transistor;

forming a probe with the FIB for electrically coupling to the transistor;

coupling a signal from the probe and analyzing the transistor therefrom;

subsequent to analyzing the transistor, removing the probe and repairing the etched portion of circuitry in the die using the FIB; and depositing oxide in the etched portion of the insulator with the FIB and thereby reconstructing the SOI structure.

16. A system for analyzing a flip-chip semiconductor die having SOI structure and a circuit side opposite a back side, the system comprising:

means for removing a selected portion of substrate from the die and forming an exposed region, the selected portion including a portion of the insulator of the SOI structure;

means for coupling a signal from a circuit portion in the circuit side of the die via the exposed region and analyzing the die therefrom; and means for depositing material in the exposed region and thereby reconstructing the selected portion of the die having been removed.

17. A system for analyzing a flip-chip semiconductor die having SOI structure and a circuit side opposite a back side, the system comprising:

a FIB arrangement adapted to remove a selected portion of substrate from the die and form an exposed region, the selected portion including a portion of the insulator of the SOI structure;

a testing arrangement adapted to couple a signal from a selected circuit portion in the die via the exposed region and analyze the die therefrom; and a deposition arrangement adapted to deposit material in the exposed region and thereby reconstruct the selected portion of the die having been removed.

18. The system of claim 17, wherein the FIB arrangement is adapted perform at least one of: etching bulk silicon substrate from the back side of the die, etching insulator material from the SOI structure, etching conductive portions of circuitry in the die, depositing a conductive probe, depositing conductive circuitry and depositing insulator to replace the removed portion of the insulator.

19. The system of claim 17, further comprising a stimulating arrangement adapted to stimulate the selected circuit portion to generate the coupled signal.

20. The system of claim 17, wherein the FIB arrangement is adapted to repair a portion of defective circuitry in the die and wherein the testing arrangement is adapted to test the repaired portion.

* * * * *

UNITED STATES PATENT AND TRADEMARK OFFICE
CERTIFICATE OF CORRECTION

PATENT NO. : 6,448,095 B1
DATED : September 10, 2002
INVENTOR(S) : Birdsley et al.

It is certified that error appears in the above-identified patent and that said Letters Patent is hereby corrected as shown below:

Column 5,
Line 18, "6/372,627" should read -- 6,372,627 --.

Signed and Sealed this

Fifteenth Day of April, 2003

JAMES E. ROGAN
*Director of the United States Patent and Trademark Office*